United States Patent
Agan et al.

(10) Patent No.: US 7,256,616 B1
(45) Date of Patent: Aug. 14, 2007

(54) MAGNETIC TRANSISTOR WITH THE BUFFER/INVERTER FUNCTIONS

(75) Inventors: Tom Allen Agan, St. Paul, MN (US); James Chyi Lai, St. Paul, MN (US)

(73) Assignee: Northern Lights Semiconductor Corp., St. Paul, MN (US)

( * ) Notice: Subject to any disclaimer, the term of this patent is extended or adjusted under 35 U.S.C. 154(b) by 0 days.

(21) Appl. No.: 11/549,713

(22) Filed: Oct. 16, 2006

Related U.S. Application Data (60) Provisional application No. 60/727,321, filed on Oct. 17, 2005.

(51) Int. Cl.
*H03K 19/0175* (2006.01)
*H03K 19/20* (2006.01)

(52) U.S. Cl. .............................. 326/82; 326/104

(58) Field of Classification Search ............ 326/82, 326/104
See application file for complete search history.

(56) References Cited

U.S. PATENT DOCUMENTS

| 2007/0085569 A1* | 4/2007 | Agan et al. ................ 326/104 |
| 2007/0086104 A1* | 4/2007 | Agan et al. .................. 360/46 |
| 2007/0086234 A1* | 4/2007 | Agan et al. ................ 365/158 |
| 2007/0103196 A1* | 5/2007 | Agan et al. .................. 326/52 |

* cited by examiner

*Primary Examiner*—Evan Pert
(74) *Attorney, Agent, or Firm*—Thomas, Kayden, Horstemeyer & Risley (57) ABSTRACT

A magnetic transistor circuit has a first and a second magnetic transistor. These two magnetic transistors that work as the ordinary transistors can be turned on or turned off by the control of several metal devices respectively disposed around the magnetic transistors. The buffer and inverter logic functions of the binary system can be implemented by the control of these metal devices.

16 Claims, 6 Drawing Sheets

MAGNETIC TRANSISTOR WITH THE BUFFER/INVERTER FUNCTIONS

CROSS-REFERENCE TO RELATED APPLICATION

This application claims the priority benefit of provisional application Ser. No. 60/727,321, filed on Oct. 17, 2005, the full disclosure of which is incorporated herein by reference.

BACKGROUND

1. Field of Invention

The present invention relates to a transistor circuit with the buffer/inverter functions. More particularly, the present invention relates to a transistor circuit with the buffer/inverter functions configured by several magnetic transistors.

2. Description of Related Art

The buffer and inverter circuits are very important for IC circuit design. The designer can combine these two logic circuits with other logic circuits to implrement the required functions.

Figure 1:
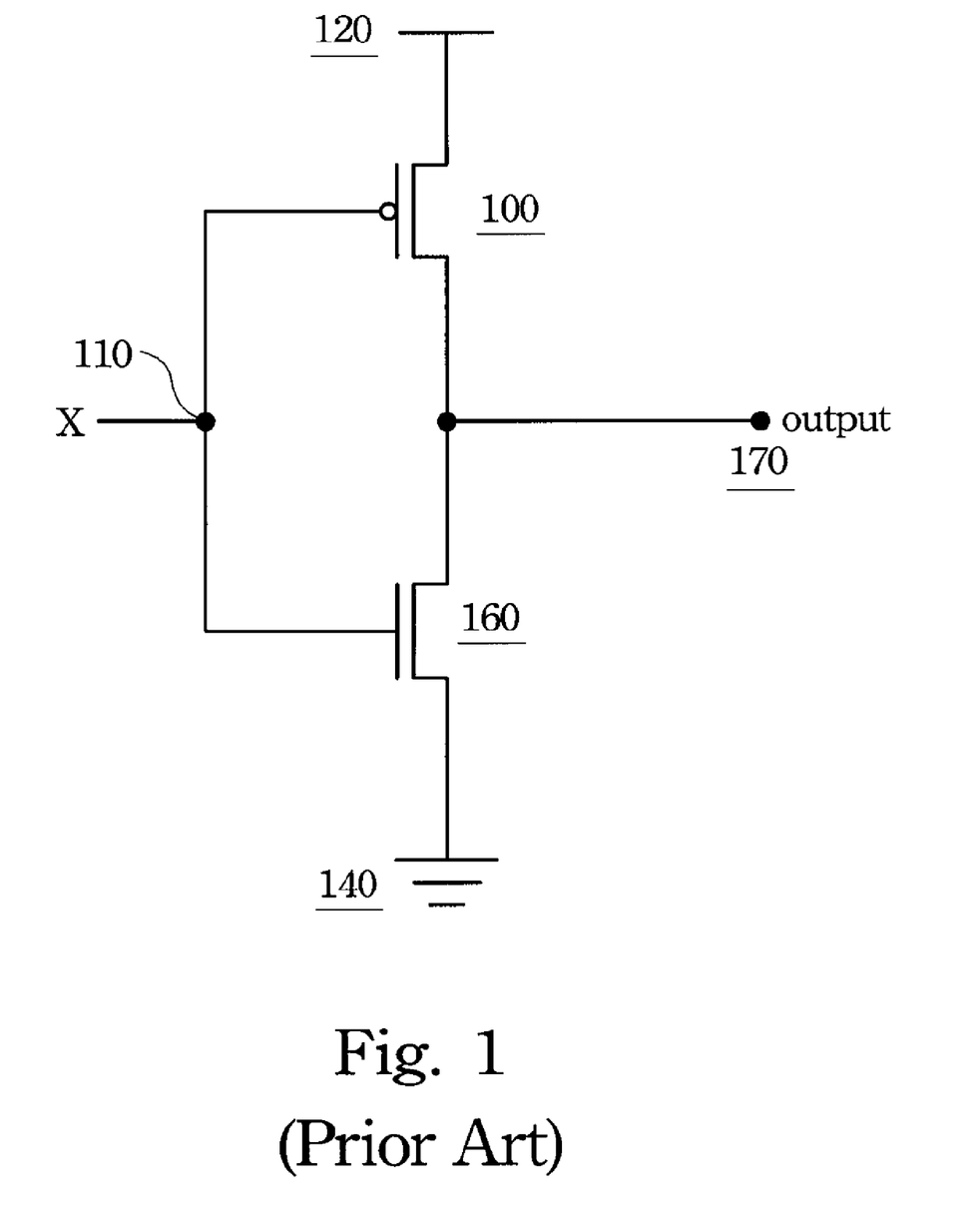
FIG. 1 is a CMOS circuit with the inverter function of the prior art.

FIG. 1 is a CMOS circuit with the inverter function of the prior art. The CMOS circuit has one PMOS transistor 100 coupled to a high voltage end 120, and one NMOS transistor 160 coupled to a low voltage end 140. The input signal 'X' at the input end 110 controls the PMOS transistor 100 and NMOS transistor 160. The CMOS circuit generates the inverter function (output=X') at the output end 170.

The Giant Magnetoresistance Effect (GMR) is a quantum mechanical effect observed in structures with alternating thin magnetic and thin nonmagnetic sections. The GMR effect shows a significant change in electrical resistance from the zero-field high resistance state to the high-field low resistance state according to an applied external field.

Therefore, the GMR effect can be used to design the magnetic transistor. Thus, magnetic transistors can further be used to integrate a magnetic transistor circuit without the expensive process and equipment. The magnetic transistor circuit can be designed and manufactured with short programming time and high density.

For the foregoing reasons, there is a need to have a magnetic transistor circuit with the buffer/inverter functions integrated by magnetic transistors.

SUMMARY

It is therefore an aspect of the present invention to provide a transistor circuit device with the buffer/inverter functions implemented by magnetic transistors.

According to one embodiment of the present invention, the magnetic transistor circuit has a first and a second magnetic transistor. The first magnetic transistor has a first magnetic section and a second magnetic section, wherein the first magnetic section couples to a high voltage end, and the second magnetic section couples to an output end. The second magnetic transistor has a third magnetic section and a fourth magnetic section, wherein the third magnetic section couples to a low voltage end, and the fourth magnetic section couples to the second magnetic section and the output end. The second and the fourth magnetic section have same dipole to control the output data outputted at the output end.

According to another embodiment of the present invention, the method uses a magnetic transistor circuit to generate the buffer and the inverter functions. The method comprises using a first magnetic transistor having a first magnetic section and a second magnetic section, wherein the first magnetic section couples to a high voltage end, and the second magnetic section couples to an output end; and using a second magnetic transistor having a third magnetic section and a fourth magnetic section, wherein the third magnetic section couples to a low voltage end, and the fourth magnetic section couples to the second magnetic section and the output end. When the method uses the magnetic transistor circuit to generate the buffer function, the method makes dipoles of the first and the third magnetic sections a first dipole and a second dipole respectively. When the method uses the magnetic transistor circuit to generate the inverter function, the method makes dipoles of the first and the third magnetic sections the second dipole and the first dipole respectively. The method makes the second and the fourth magnetic section have same dipole and uses the dipole of the second and the fourth magnetic section to control the output data outputted at the output end.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

All figures are drawn for ease of explanation of the basic teachings of the present invention only; the extensions of the figures with respect to number, position, relationship, and dimensions of the parts to form the embodiment will be explained or will be within the skill of the art after the following description has been read and understood. Further, the exact dimensions and dimensional proportions to conform to specific force, weight, strength, and similar requirements will likewise be within the skill of the art after the following description has been read and understood.

Figure 2:
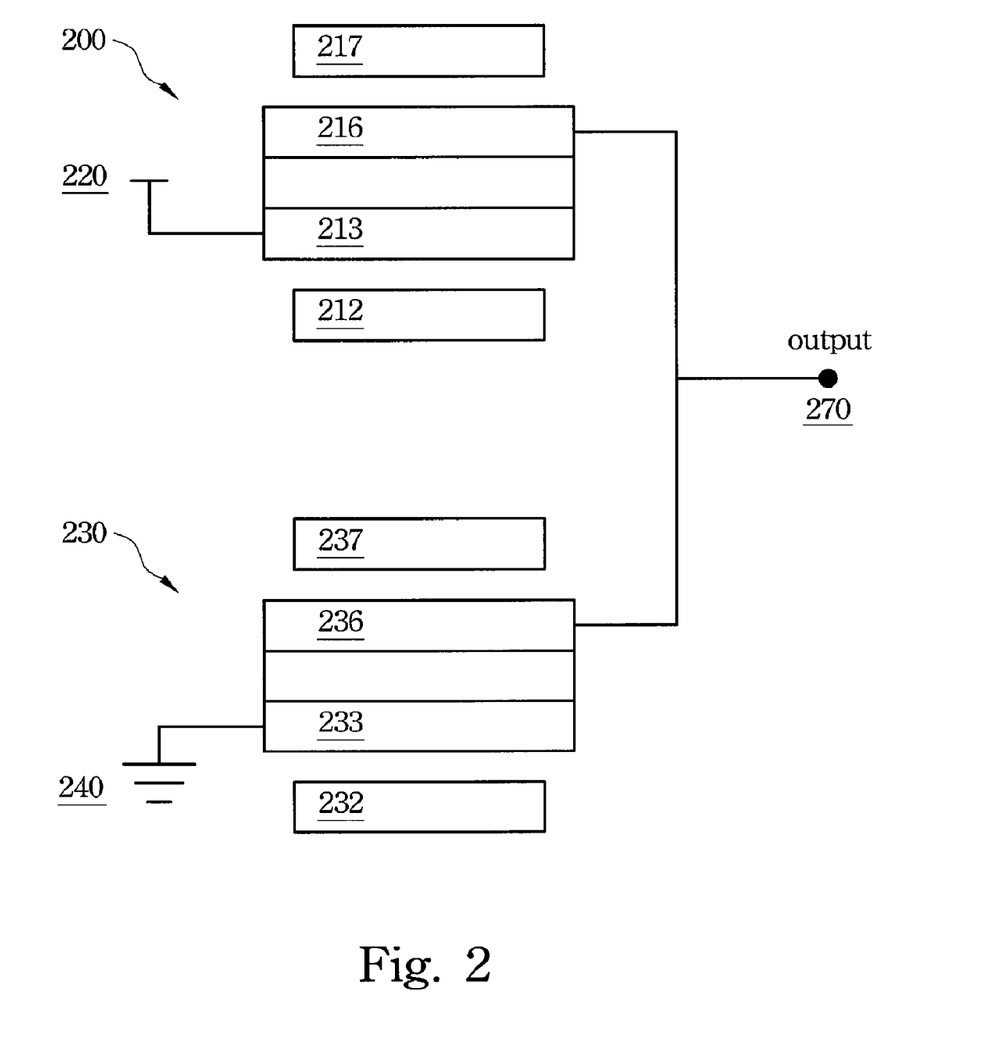
FIG. 2 is the magnetic transistor circuit with the buffer/inverter functions according to the embodiment of this invention.

FIG. 2 is the magnetic transistor circuit with the buffer/inverter functions according to the embodiment of this invention. The magnetic transistor circuit has a first magnetic transistor 200 and a second magnetic transistor 230. The first magnetic transistor 200 has a first magnetic section 213 and a second magnetic section 216, wherein the first magnetic section 213 couples to a high voltage end 220, and the second magnetic section 216 couples to an output end 270. The second magnetic transistor 230 has a third magnetic section 233 and a fourth magnetic section 236, wherein the third magnetic section 233 couples to a low voltage end 240, and the fourth magnetic section 236 couples to the second magnetic section 216 and the output end 270. The second and the fourth magnetic section 216 and 236 have same dipole to control the output data outputted at the output end 270.

The magnetic transistor circuit further comprises a plurality of metal devices 212, 217, 232 and 237 respectively disposed around the magnetic sections 213, 216, 233 and 236. The metal devices 212, 217, 232 and 237 are arranged to respectively control dipoles of the magnetic sections 213, 216, 233 and 236. For example, the first magnetic transistor 200 has metal devices 212 and 217 respectively disposed around the magnetic sections 213 and 216. The metal device 212 is arranged to control the dipole of the magnetic section 213, and the metal device 217 is arranged to control the dipole of the magnetic section 216.

By the description above, the designer can use the metal devices to control the dipoles of the magnetic sections. The designer can further use the dipoles of these two magnetic sections of one magnetic transistor to control the conductivity between these two magnetic sections elves.

For example, when dipoles of the first magnetic section 213 and the second magnetic section 216 are the same, the first magnetic section 213 and the second magnetic section 216 are conductive, when dipoles of the first magnetic section 213 and the second magnetic section 216 are different, the first magnetic section 213 and the second magnetic section 216 are not conductive.

When dipoles of the third magnetic section 233 and the fourth magnetic section 236 are the same, the third magnetic section 233 and the fourth magnetic section 236 are conductive, when dipoles of the third magnetic section 233 and the fourth magnetic section 236 are different, the third magnetic section 233 and the fourth magnetic section 236 are not conductive.

By the description above, characteristics of the magnetic transistor can be used to implement a circuit with some logic functions.

Figure 3A:
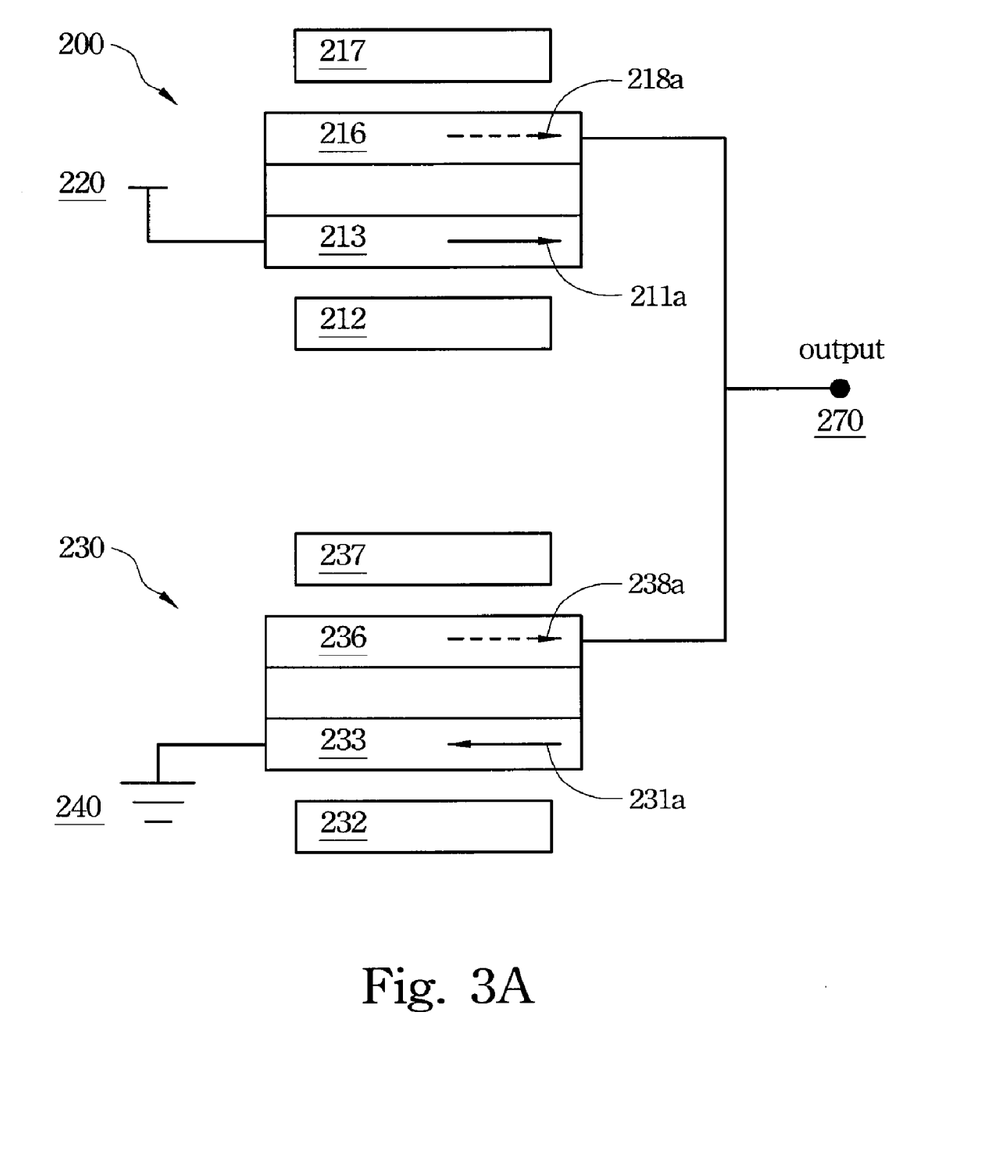
FIG. 3A is the magnetic transistor circuit operating a buffer function of the binary system according to the embodiment of this invention.

FIG. 3A is the magnetic transistor circuit operating a buffer function of the binary system according to the embodiment of this invention. Wherein when the magnetic transistor circuit operates the buffer function to output data '1' of the binary system, dipoles 218*a* and 238*a* of the second and fourth magnetic sections 216 and 236 are a first dipole that represents data '1' of the binary system to control the output data, and dipoles 211*a* and 231*a* of the first and third magnetic sections 213 and 233 are the first dipole and a second dipole respectively.

Figure 3B:
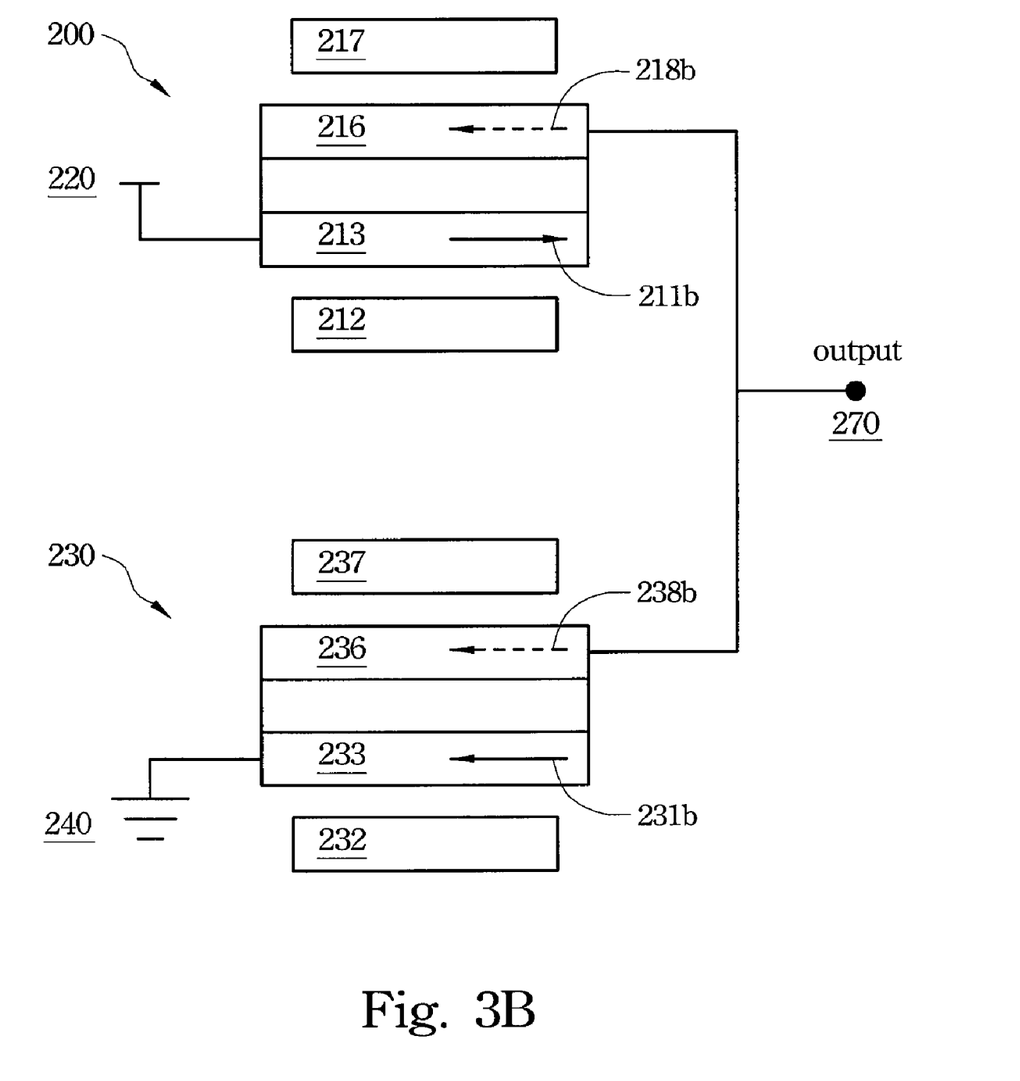
FIG. 3B is the magnetic transistor circuit operating another buffer function of the binary system according to the embodiment of this invention.

FIG. 3B is the magnetic transistor circuit operating another buffer function of the binary system according to the embodiment of this invention. Wherein when the magnetic transistor circuit operates the buffer function to output data '0' of the binary system, dipoles 218*b* and 238*b* of the second and fourth magnetic sections 216 and 236 are a second dipole that represents data '0' of the binary system to control the output data, and dipoles 211*b* and 231*b* of the first and third magnetic sections 213 and 233 are the first dipole and the second dipole respectively.

Figure 3C:
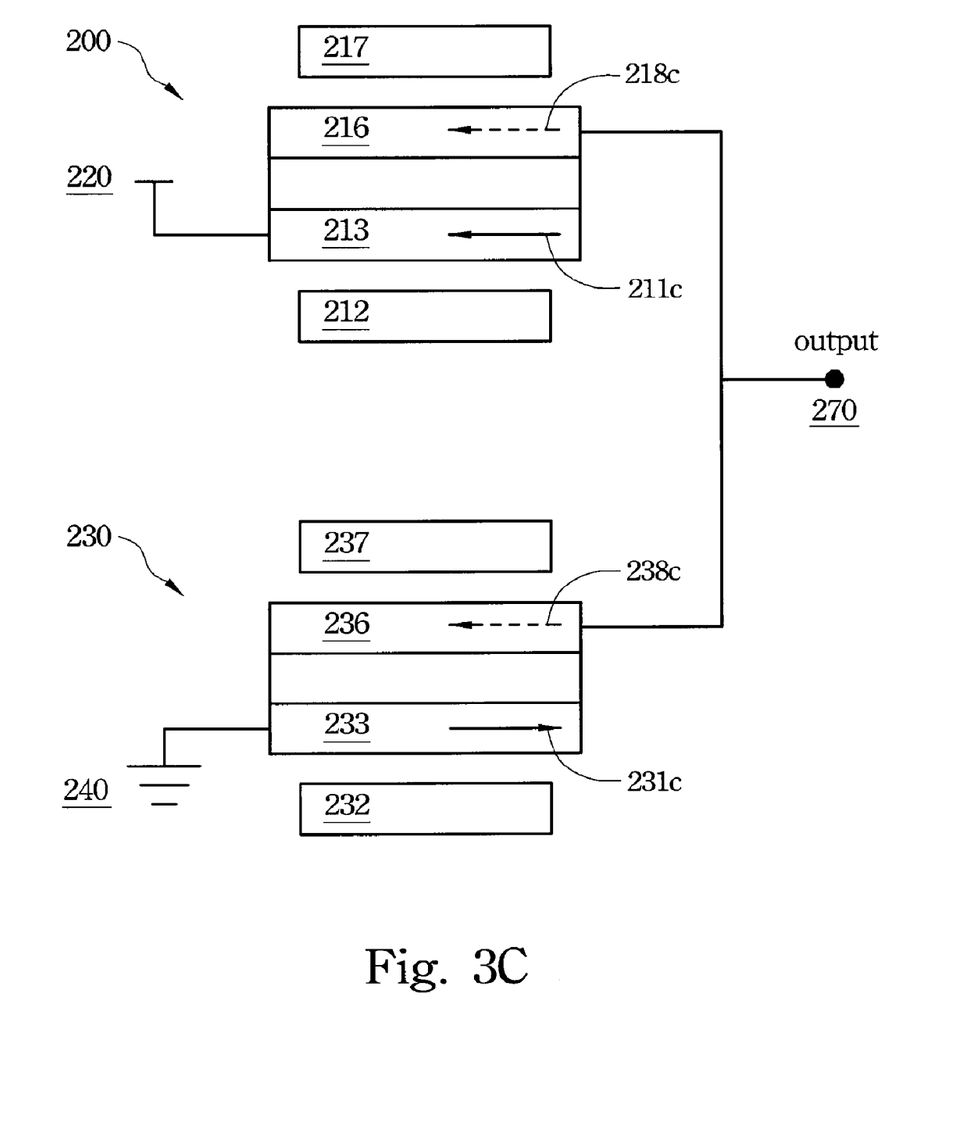
FIG. 3C is the magnetic transistor circuit operating an inverter function of the binary system according to the embodiment of this invention.

FIG. 3C is the magnetic transistor circuit operating an inverter function of the binary system according to the embodiment of this invention.

The inverter function is:

output=X'

The truth table of the inverter logic function of the binary system according to the embodiment of this invention is:

|  | output |
| --- | --- |
| Dipole X = 0 (←) | 1 |
| Dipole X = 1 (→) | 0 |

Wherein 'output' is the data outputted at the output end 270, 'X' is dipoles of the magnetic sections 216 and 236. The symbols '→' and '←' are arranged to respectively represent the first dipole and the second dipole. How to use dipoles of X (dipoles of the magnetic sections 216 and 236) to create the inverter function is described as bellow.

Wherein when the magnetic transistor circuit operates the inverter function to output data '1' of the binary system, dipoles 218*c* and 238*c* of the second and fourth magnetic sections 216 and 236 are the second dipole that represents data '0' of the binary system to control the output data, and dipoles 211*c* and 231*c* of the first and third magnetic sections 213 and 233 are the second dipole and the first dipole respectively.

Figure 3D:
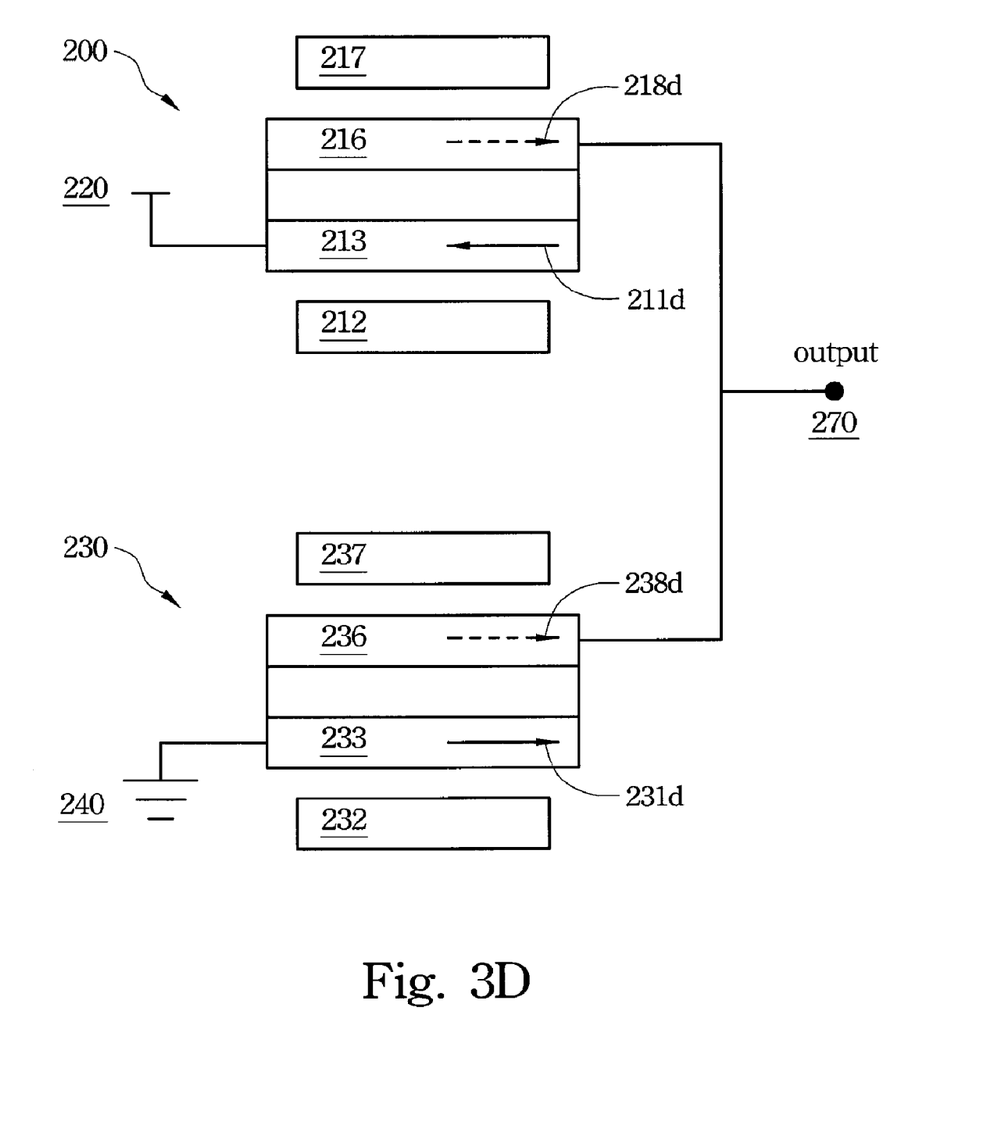
FIG. 3D is the magnetic transistor circuit operating another inverter function of the binary system according to the embodiment of this invention.

FIG. 3D is the magnetic transistor circuit operating another inverter function of the binary system according to the embodiment of this invention. Wherein when the magnetic transistor circuit operates the inverter function to output data '0' of the binary system, dipoles 218*d* and 238*d* of the second and fourth magnetic sections 216 and 236 are the first dipole that represents data '1' of the binary system to control the output data, and dipoles 211*d* and 231*d* of the first and third magnetic sections 213 and 233 are the second dipole and the first dipole respectively.

Therefore, the magnetic transistor circuit can operate the buffer and the inverter functions by same device. On the other way, take the FIG. 3A for example, the designer or user can use the device with fixed dipole 211*a* (first dipole) and 231*a* (second dipole) of the first and third magnetic sections 213 and 233 respectively, and changes the dipole of 218*a* and 238*a* of the second and fourth magnetic sections 216 and 236 together to create the buffer function. The designer or user also can use the device with fixed dipole 211*a* (second dipole) and 231*a* (first dipole) of the first and third magnetic sections 213 and 233 respectively, and changes the dipole of 218*a* and 238*a* of the second and fourth magnetic sections 216 and 236 together to create the inverter function.

Moreover, the present invention also provided a method using a magnetic transistor circuit to generate the buffer and the inverter functions. The method comprises using a first magnetic transistor 220 having a first magnetic section 213 and a second magnetic section 216, wherein the first magnetic section 213 couples to a high voltage end 220, and the second magnetic section 216 couples to an output end 270; and using a second magnetic transistor 230 having a third magnetic section 233 and a fourth magnetic section 236, wherein the third magnetic section 233 couples to a low voltage end 240, and the fourth magnetic section 236 couples to the second magnetic section 216 and the output end 270.

When the method uses the magnetic transistor circuit to generate the buffer function, the method makes dipoles of the first and the third magnetic sections 213 and 233 a first dipole and a second dipole respectively. When the method uses the magnetic transistor circuit to generate the inverter function, the method makes dipoles of the first and the third magnetic sections 213 and 233 the second dipole and the first dipole respectively. The method makes the second and the fourth magnetic section 216 and 236 have same dipole and uses the dipole of the second and the fourth magnetic section 216 and 236 to control the output data outputted at the output end 270.

When the magnetic transistor circuit operates the buffer function to output data '1' of the binary system, the method makes dipoles of the second and fourth magnetic sections 216 and 236 the first dipole that represents data '1' of the binary system. When the magnetic transistor circuit operates the buffer function to output data '0' of the binary system, the method makes dipoles of the second and fourth magnetic sections 216 and 236 the second dipole that represents data '0' of the binary system.

When the magnetic transistor circuit operates the inverter function to output data '1' of the binary system, the method makes dipoles of the second and fourth magnetic sections 216 and 236 the second dipole that represents data '0' of the binary system. When the magnetic transistor circuit operates the inverter function to output data '0' of the binary system, the method makes dipoles of the second and fourth magnetic sections 216 and 236 the first dipole that represents data '1' of the binary system.

In order to corporate with the ordinary integrated circuits of semiconductor, a voltage of the low voltage end 240 is about 0 volt, and a voltage of the high voltage end 220 is about 2.5 volt, 3.3 volt or 5 volt.

The symbols '→' and '←' here are just arranged to respectively represent the dipoles of the magnetic sections, not arranged to restrict the dipole directions. In the magnetic transistor circuit, each magnetic transistor has a conductive section between two magnetic sections. The conductivity of the conductive section can be controlled by the dipoles of these two magnetic sections. Therefore, the magnetic transistor circuit is a one-input circuit with the buffer function and the inverter function. By the description above, the magnetic transistor circuit and method described above can be used to generate the buffer function to enhance the signal, and generate the inverter function to inverse the signal.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A magnetic transistor circuit with the buffer and the inverter functions, comprising:
    a first magnetic transistor having a first magnetic section and a second magnetic section, wherein the first magnetic section couples to a high voltage end, and the second magnetic section couples to an output end; and
    a second magnetic transistor having a third magnetic section and a fourth magnetic section, wherein the third magnetic section couples to a low voltage end, and the fourth magnetic section couples to the second magnetic section and the output end;
    wherein the second and the fourth magnetic section have same dipole to control the output data outputted at the output end.

2. The magnetic transistor circuit with the buffer and the inverter functions of claim 1, further comprising a plurality of metal devices respectively disposed around the magnetic sections, wherein the metal devices are arranged to respectively control dipoles of the magnetic sections.

3. The magnetic transistor circuit with the buffer and the inverter functions of claim 1, wherein when dipoles of the first magnetic section and the second magnetic section are the same, the first magnetic section and the second magnetic section are conductive, when dipoles of the first magnetic section and the second magnetic section are different, the first magnetic section and the second magnetic section are not conductive.

4. The magnetic transistor circuit with the buffer and the inverter functions of claim 1, wherein when dipoles of the third magnetic section and the fourth magnetic section are the same, the third magnetic section and the fourth magnetic section are conductive, when dipoles of the third magnetic section and the fourth magnetic section are different, the third magnetic section and the fourth magnetic section are not conductive.

5. The magnetic transistor circuit with the buffer and the inverter functions of claim 1, wherein when the magnetic transistor circuit operates the buffer function to output data '1' of the binary system, dipoles of the second and fourth magnetic sections are a first dipole that represents data '1' of the binary system to control the output data, and dipoles of the first and third magnetic sections are the first dipole and a second dipole respectively.

6. The magnetic transistor circuit with the buffer and the inverter functions of claim 1, wherein when the magnetic transistor circuit operates the buffer function to output data '0' of the binary system, dipoles of the second and fourth magnetic sections are the second dipole that represents data '0' of the binary system to control the output data, and dipoles of the first and third magnetic sections are the first dipole and the second dipole respectively.

7. The magnetic transistor circuit with the buffer and the inverter functions of claim 1, wherein when the magnetic transistor circuit operates the inverter function to output data '1' of the binary system, dipoles of the second and fourth magnetic sections are the second dipole that represents data '0' of the binary system to control the output data, and dipoles of the first and third magnetic sections are the second dipole and the first dipole respectively.

8. The magnetic transistor circuit with the buffer and the inverter functions of claim 1, wherein when the magnetic transistor circuit operates the inverter function to output data '0' of the binary system, dipoles of the second and fourth magnetic sections are the first dipole that represents data '1' of the binary system to control the output data, and dipoles of the first and third magnetic sections are the second dipole and the first dipole respectively.

9. A method using a magnetic transistor circuit to generate the buffer and the inverter functions, comprising:
    using a first magnetic transistor having a first magnetic section and a second magnetic section, wherein the first magnetic section couples to a high voltage end, and the second magnetic section couples to an output end;
    using a second magnetic transistor having a third magnetic section and a fourth magnetic section, wherein the third magnetic section couples to a low voltage end, and the fourth magnetic section couples to the second magnetic section and the output end;

when using the magnetic transistor circuit to generate the buffer function, making dipoles of the first and the third magnetic sections a first dipole and a second dipole respectively;

when using the magnetic transistor circuit to generate the inverter function, making dipoles of the first and the third magnetic sections the second dipole and the first dipole respectively; and making the second and the fourth magnetic section have same dipole and using the dipole of the second and the fourth magnetic section to control the output data outputted at the output end.

10. The method of claim 9, further comprising using a plurality of metal devices respectively disposed around the magnetic sections, wherein the metal devices are arranged to respectively control dipoles of the magnetic sections.

11. The method of claim 9, wherein when dipoles of the first magnetic section and the second magnetic section are the same, the first magnetic section and the second magnetic section are conductive, when dipoles of the first magnetic section and the second magnetic section are different, the first magnetic section and the second magnetic section are not conductive.

12. The method of claim 9, wherein when dipoles of the third magnetic section and the fourth magnetic section are the same, the third magnetic section and the fourth magnetic section are conductive, when dipoles of the third magnetic section and the fourth magnetic section are different, the third magnetic section and the fourth magnetic section are not conductive.

13. The method of claim 9, wherein when the magnetic transistor circuit operates the buffer function to output data '1' of the binary system, making dipoles of the second and fourth magnetic sections the first dipole that represents data '1' of the binary system to control the output data.

14. The method of claim 9, wherein when the magnetic transistor circuit operates the buffer function to output data '0' of the binary system, making dipoles of the second and fourth magnetic sections the second dipole that represents data '0' of the binary system to control the output data.

15. The method of claim 9, wherein when the magnetic transistor circuit operates the inverter function to output data '1' of the binary system, making dipoles of the second and fourth magnetic sections the second dipole that represents data '0' of the binary system to control the output data.

16. The method of claim 9, wherein when the magnetic transistor circuit operates the inverter function to output data '0' of the binary system, making dipoles of the second and fourth magnetic sections the first dipole that represents data '1' of the binary system to control the output data.

* * * * *

UNITED STATES PATENT AND TRADEMARK OFFICE
CERTIFICATE OF CORRECTION

PATENT NO. : 7,256,616 B1  Page 1 of 1
APPLICATION NO. : 11/549713
DATED : August 14, 2007
INVENTOR(S) : Agan et al.

It is certified that error appears in the above-identified patent and that said Letters Patent is hereby corrected as shown below:

On the cover page, item [54] the title should read: Magnetic Transistor Circuit with the Buffer/Inverter Functions Signed and Sealed this Seventeenth Day of June, 2008

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,256,616 B1 |
| APPLICATION NO. | : 11/549713 |
| DATED | : August 14, 2007 |
| INVENTOR(S) | : Agan et al. |

It is certified that error appears in the above-identified patent and that said Letters Patent is hereby corrected as shown below:

On the cover page, item [54] and Column 1, lines 1 and 2 the title should read: Magnetic Transistor Circuit with the Buffer/Inverter Functions This certificate supersedes the Certificate of Correction issued June 17, 2008.

Signed and Sealed this

Twenty-second Day of July, 2008

JON W. DUDAS
*Director of the United States Patent and Trademark Office*